United States Patent
Kobayashi et al.

(10) Patent No.: US 6,794,948 B2
(45) Date of Patent: Sep. 21, 2004

(54) OSCILLATION CIRCUIT AND ELECTRONICS USING THE SAME

(75) Inventors: Yoshihiro Kobayashi, Suwa (JP); Nobuyuki Imai, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/209,282

(22) Filed: Jul. 31, 2002

(65) Prior Publication Data

US 2003/0034852 A1 Feb. 20, 2003

(30) Foreign Application Priority Data

| Jul. 31, 2001 | (JP) | 2001-232458 |
| Oct. 15, 2001 | (JP) | 2001-317283 |
| May 1, 2002 | (JP) | 2002-130074 |

(51) Int. Cl.[7] ............................................. H01L 44/00

(52) U.S. Cl. ........................................ 331/154; 331/158

(58) Field of Search ................................. 331/154, 167 A, 331/158, 160; 333/155

(56) References Cited

U.S. PATENT DOCUMENTS

| 4,639,697 A | * | 1/1987 | Yarranton et al. | 333/155 |
| 4,797,639 A | * | 1/1989 | Driscoll | 331/158 |
| 5,039,957 A | * | 8/1991 | Greer et al. | 331/107 A |
| 5,345,201 A | * | 9/1994 | Greer et al. | 333/193 |

* cited by examiner

*Primary Examiner*—Linh M. Nguyen
(74) *Attorney, Agent, or Firm*—Harness, Dickey & Pierce, P.L.C.

(57) ABSTRACT

An oscillation circuit is provided with a positive feedback oscillation loop constructed by an amplifier, a SAW resonator with a prescribed resonance frequency, a phase-shifting circuit which outputs the phase of an input signal as an output signal with a prescribed shift and a tank circuit composed of an inductance element and a capacitive element, and an NTC thermistor with negative temperature characteristics is connected in parallel to the tank circuit. Moreover, a capacitive element with a capacity-temperature characteristic for correcting the quadratic frequency-temperature characteristic of the SAW resonator is used in the oscillation circuit as the oscillation element of the tank circuit.

15 Claims, 17 Drawing Sheets

T0(25°C)
Temperature

T0
Temperature

US 6,794,948 B2

OSCILLATION CIRCUIT AND ELECTRONICS USING THE SAME

BACKGROUND OF THE INVENTION

1. Technical Field of the Invention

This invention relates to an oscillation circuit and electronics using the same and particularly to an oscillation circuit and electronics in which the temperature characteristic of oscillation frequency of a SAW resonator is corrected.

2. Prior Art

In communications equipment such as a portable telephone, the sending and reception of communication data are performed based on the output signals of an oscillator. Therefore, it has been desired to ① stably oscillate in a high frequency band (high frequency stability) and ② stably oscillate in a practical temperature range of the communication equipment (temperature compensated) from a demand of accelerating the communication.

A SAW (Surface Acoustic Wave) resonator is a device for the high-frequency oscillation of an oscillator. The SAW resonator is a resonator making use of such a property that energy concentrates and propagates nearby the surface of an elastomer. More specifically, the SAW resonator functions as a resonator by arranging comb-like electrodes on a piezoelectric substrate and reflecting a surface wave excited by the electrodes to generate a standing wave.

There are various problems in an oscillator which oscillates a high-frequency wave with this SAW resonator.

FIG. 17 is a circuit diagram of a conventional voltage-controlled SAW oscillation circuit (Voltage Controlled SAW Oscillator: VCSO), FIG. 18 is a block diagram showing a construction with an output buffer added to this VCSO. This VCSO is a circuit which variably changes the reactance and change to the phase conditions of an oscillation loop by variably controlling a control voltage $V_c$ applied to a Variable Capacitance Diode $C_v$ and thereby obtains a desirable oscillation frequency F.

However, the VCSO has problems in that not only the oscillation frequency of the VCSO but also the characteristic of control voltage $V_c$-oscillation frequency F greatly changes by the influence of ① the temperature characteristics of the Variable Capacitance Diode in which capacity greatly fluctuates, especially at a low reverse voltage (large capacity value), ② the temperature-phase characteristic of the active elements and ③ the influence of the temperature characteristic of reactance values of the passive parts such as coils, capacitors and so on.

As illustrated in detail, as the temperature characteristic of oscillation frequency F of the VCSO shown in FIG. 19, the oscillation frequency F of the VCSO sometimes greatly changes if the VCSO is at a high-temperature (e.g., 85° C.). Moreover, as a temperature characteristic of control voltage $V_c$-oscillation frequency F of the VCSO shown in FIG. 20, changes of the control voltage $V_c$-oscillation frequency F characteristic were remarkable in cases of high temperature and low temperature. This caused a problem of circuit control because the control of the control voltage $V_c$ in a high-temperature region is greatly different from the control in other temperature ranges.

Moreover, as shown in FIG. 21, the VCSO was made to have a characteristic where the variable sensitivity of the frequency is small in a region of high oscillation frequency F, i.e., when the control voltage $V_c$ is large and the variable sensitivity of the frequency is large in a region of low oscillation frequency F, i.e., when the control voltage $V_c$ is small by taking vicinity of a serial resonance frequency $F_r$ of the SAW resonator as a boundary. This characteristic is particularly significant when an extension coil is used to expand the frequency variable sensitivity to the quantity of reactance change. Therefore, the variable quantity of the control voltage $V_c$ greatly varies in cases of high frequency and low oscillation frequency F. This also complicates the control problem.

Thus, the conventional VCSO had a problem where the control voltage $V_c$-oscillation frequency F characteristic greatly changes in some temperature ranges, therefore this VCSO cannot be designed in a loop zone appropriate over the whole temperature range, in designing a PLL for forming a part of PLL circuit synchronous with the frequency of the optical network communication equipment to use as a reference clock source.

Furthermore, as shown in FIG. 22, a conventional oscillation circuit using a SAW resonance is provided with a temperature-compensating circuit 107 composed of resistances 101–104 and heat-sensitive resistors 105, 106 such as thermistors or the like and the temperature-compensating circuit 107 has a temperature compensated SAW oscillation circuit (Temperature Compensated SAW oscillator: TCSO) 100 which changes the control voltage applied to a Variable Capacitance Diode 109 according to an ambient temperature and keeps the oscillation frequency nearly constant. However, this TCSO 100 had problems that the circuit scale is large and miniaturization is difficult because it has the temperature-compensating circuit.

Still more, the construction with the exception of the temperature-compensating circuit 107 of the TCSO 100 shown in FIG. 22 is of a SAW resonator 110, condensers 108, 111, 112, 118, resistances 113, 114, 116, a transistor 115, and a Zener diode 117.

On the other hand, in addition to the method of temperature compensation with the temperature-compensating circuit 107, there is a method wherein the frequency-temperature characteristic of a SAW resonator is corrected by using capacitive elements (condensers) with prescribed capacity-temperature characteristics, as load capacity of the SAW resonator. The method wherein the frequency-temperature characteristic of the SAW resonator is corrected by using capacitive elements with capacity-temperature characteristics is illustrated below.

FIG. 23 is a graph showing the temperature characteristics of the oscillation frequency of a SAW oscillator. As shown in this graph, the temperature characteristics of the oscillation frequency of a SAW oscillator can be nearly expressed by a negative quadratic curve. The curve has a characteristic that the oscillation frequency maximizes at a certain temperature T0 (called a frequency summit temperature T0 hereafter) and the frequency decreases if the temperature changes. On the other hand, there is a relationship of an inverse proportion between the oscillation frequency and the load capacity of the SAW oscillator, if the load capacity reduces, the oscillation frequency rises.

In the case of this SAW oscillator, as shown in FIG. 24, a capacitive element having a capacity-temperature characteristic that the capacity maximizes at the frequency summit temperature T0 is used. As shown in FIG. 25, the temperature characteristics of the oscillation frequency of the SAW oscillator are in a narrow temperature range with the frequency summit temperature T0 at the center, but it is also possible to correct the oscillation frequency to a nearly constant frequency in such a temperature range.

However, this method has a problem, in that the frequency can be kept constant only in a narrow temperature range with the frequency summit temperature T0 at the center, therefore the frequency greatly changes at a high temperature or a low temperature away from the frequency summit temperature T0.

This invention was made to solve the problems in the above-mentioned prior art and is aimed at providing an oscillation circuit with improved temperature characteristics in a wide temperature range, especially in a high temperature range and the electronics using this oscillation circuit.

SUMMARY OF THE INVENTION

To solve the above problems, this invention provides an oscillation circuit characterized by a positive feedback oscillation loop constructed by an amplifier, a SAW resonator with a prescribed oscillation frequency, a phase-shifting circuit for outputting the phase of an input signal with a prescribed shift as an output signal and a tank circuit composed of inductance elements and capacitive elements, and an NTC thermistor having a negative temperature characteristic, connected in parallel to the tank circuit.

The above construction improves the frequency-temperature characteristics of a feedback type VCSO and gives an oscillation circuit with a stabilized frequency even if the surroundings are at a high-temperature because the NTC thermistor functions to increase the amount of phase compensation of the tank circuit in a high-temperature range.

In the above construction, the amplifier may also be a differential amplifier having an inverting input terminal and a non-inverting input terminal in which a bias voltage is input into either side of the inverting input terminal or the non-inverting input terminal and the other side functions as the input end of the positive feedback oscillation loop.

The above construction is characterized by the tank circuit being connected between the inverting input terminal and the non-inverting input terminal of the differential amplifier.

In an oscillation circuit having an amplifier, a resonator having quadratic frequency-temperature characteristics, a feedback amplifier circuit for oscillating the resonator and a tank circuit having frequency selectivity at a nearby desirable frequency, this invention provides an oscillation circuit characterized by any one or more of the capacitive elements constructing the tank circuit having a capacity-temperature characteristic for correcting the quadratic frequency-temperature characteristics of the resonator.

According to the above construction, the quantity of the frequency change of a resonator given by the capacity change of the capacitive elements constructing the tank circuit is much more than the quantity of the frequency change of the resonator given by the capacity change of the other capacitive elements. Therefore the quadratic frequency-temperature characteristic of the resonator can be corrected in a wide temperature range by the capacitive elements constructing the tank circuit having the capacity temperature characteristic for correcting the quadratic frequency-temperature of the resonator.

The above construction is characterized in that any one or more of capacitive elements constructing the tank circuit have the capacity-temperature characteristic with the maximum capacity in the vicinity of a temperature at which the maximum oscillation frequency of the resonator is obtained. Therefore, the case where the temperature is overcompensated or under-compensated in the range of high temperature or low temperature is prevented from occurring, and maximum effect in temperature compensation is obtained.

In the above construction, the oscillation circuit may also have a phase-shifting circuit for changing the phase of a reference signal flowing into the positive feedback oscillation loop by a prescribed quantity and outputting it to satisfy phase the conditions of the oscillation circuit. Therefore, the phase condition of the oscillation circuit is easily satisfied.

In the above construction, the phase-shifting circuit may also have a construction where the quantity of phase shift can be adjusted with an external signal. Therefore, the oscillation frequency of above oscillation circuit is adjusted with an external signal (e.g., control voltage $V_c$) arbitrarily.

In the above construction, it is preferable that the amplifier is a differential amplifier using an ECL line receiver from viewpoints of high-speed actuations and consumed power reduction.

This invention can provide an optical interface module which provides electronics for use in a high-temperature range to perform data sending and reception stably, e.g., via an optical network without being affected by ambient temperature by use of these oscillation circuits.

DETAILED DESCRIPTION OF THE PREFERRED EMBODIMENTS OF THE INVENTION

Figure 1:
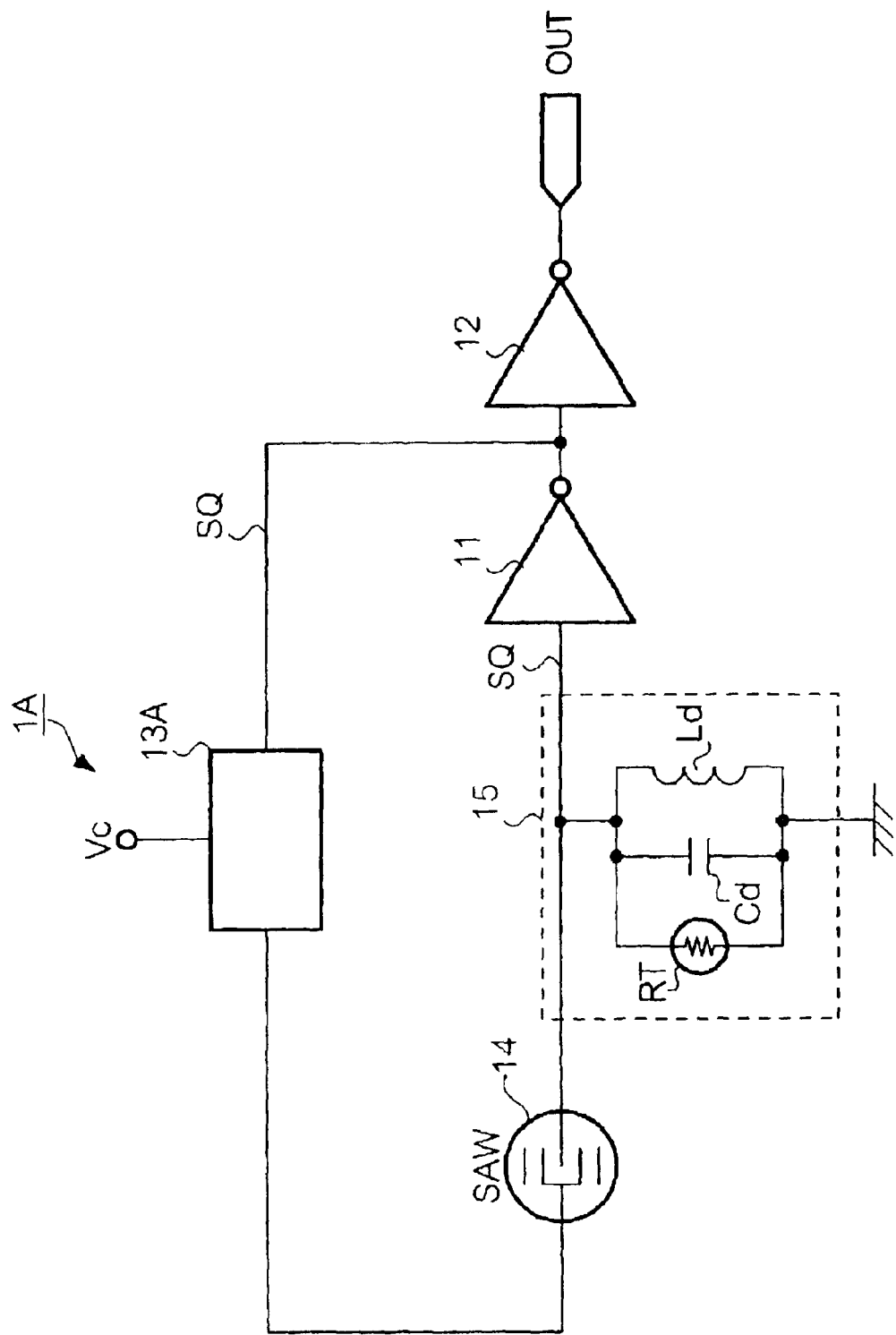
FIG. 1 is a block diagram showing the construction of the oscillation circuit relating to Embodiment 1 of this invention.

Embodiments of this invention are illustrated in the drawings below.

(1) Embodiment 1

An oscillation circuit 1A relating to the Embodiment 1 of this invention is constructed by connecting a tank circuit to the conventional VCSO. FIG. 1 is a block diagram showing one example of a specific construction of this oscillation circuit 1A.

The oscillation circuit 1A comprises amplifiers 11, 12, a phase-shifting circuit 13A for adjusting the quantity of phase shift in an oscillation loop described later, a SAW resonator 14 and a tank circuit 15. A positive feedback oscillation loop is formed by the amplifier 11, the phase-shifting circuit 13A, the SAW resonator 14 and the tank circuit 15.

The tank circuit 15 selectively gives a gain to a desirable frequency by adopting a resonance circuit. Namely, the tank circuit 15 selects a signal SQ having a frequency f0 from a reference oscillating signal given by the SAW resonator 14 and supplies it to the amplifier 11.

The phase-shifting circuit 13A performs a phase adjustment for satisfying the phase conditions of the oscillation circuit 1A and adjusts the quantity of the phase shift of the output signal SQ according to an input control voltage $V_c$.

The amplifiers 11, 12 amplify the inputted output signal SQ to a prescribed level and output it. Here, a gain is set up for the amplifier 11, such that a gain of the positive feedback oscillation loop becomes 1 or above to continue the oscillation. The amplifier 12 is provided to reduce the influence between the positive feedback oscillation loop and the output, and it may also be omitted.

Here, the tank circuit 15 of this embodiment adopts such a construction where a capacitive element Cd, an inductance element Ld and an NTC (Negative Temperature Coefficient) thermistor RT are connected in parallel. One end thereof is connected to the positive feedback oscillation loop and the other end is grounded. This tank circuit 15 is illustrated below.

Figure 2:
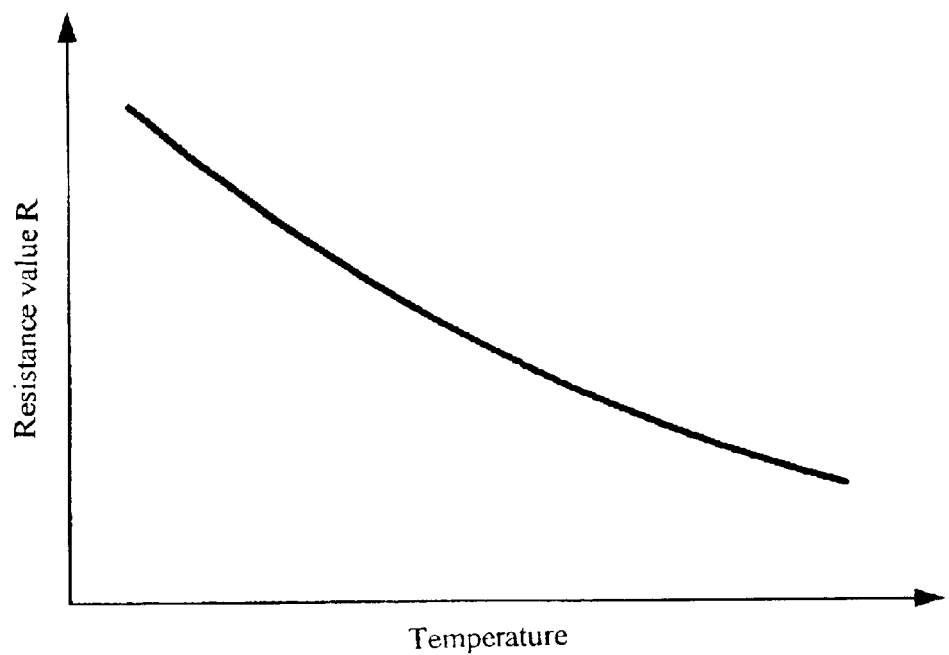
FIG. 2 is a characteristic curve graph showing the temperature characteristic of resistance value of the NTC thermistor.

As the temperature characteristic of the resistance R is shown in FIG. 2, the NTC thermistor RT has a negative temperature characteristic, such that the higher the temperature, the lower the resistance value. In this graph, the vertical axis (resistance value) is the LOG scale.

Figure 3:
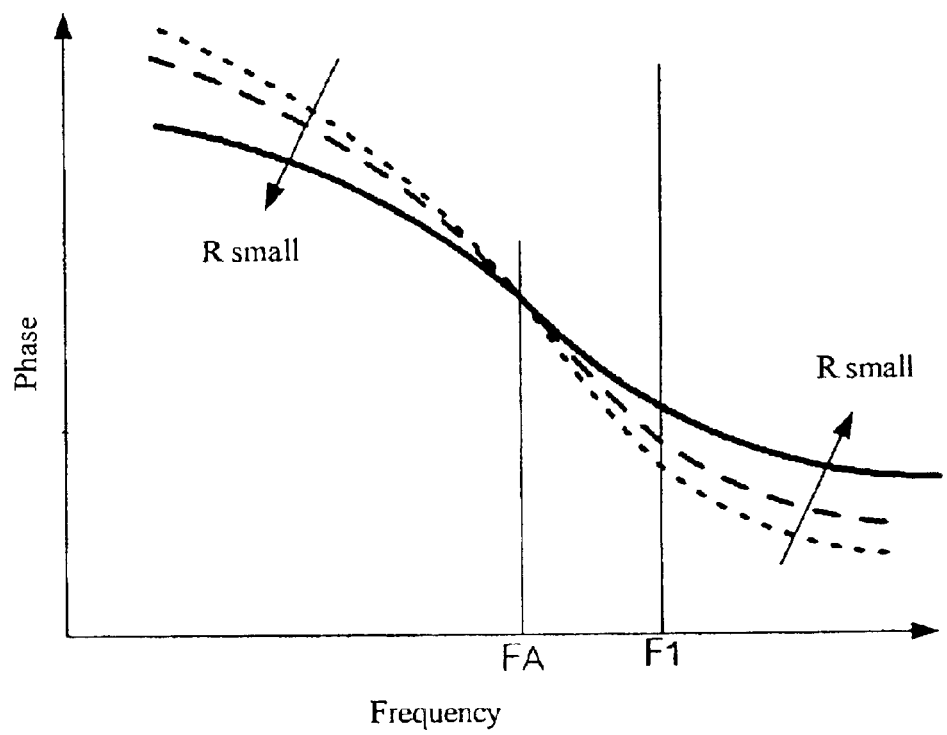
FIG. 3 is a characteristic curve graph showing the frequency-transmitting phase characteristic in the case of changing resistance value R of the NTC thermistor of tank circuit.

FIG. 3 is a graph showing the respective frequency-transmitting phase characteristics when changing the resistance value R of NTC thermistor RT of this tank circuit 15. As shown by arrows in the same graph, the frequency-transmitting phase characteristic changes in a manner such that the smaller the resistance value R is, the more the phase will rotate to the left with the resonance frequency FA of this tank circuit 15 as the center. In other words, the smaller the resistance value R, the closer to a flat characteristic the frequency-transmitting phase characteristic and the smaller the change in quantity of phase transmission for frequency change.

Figure 4:
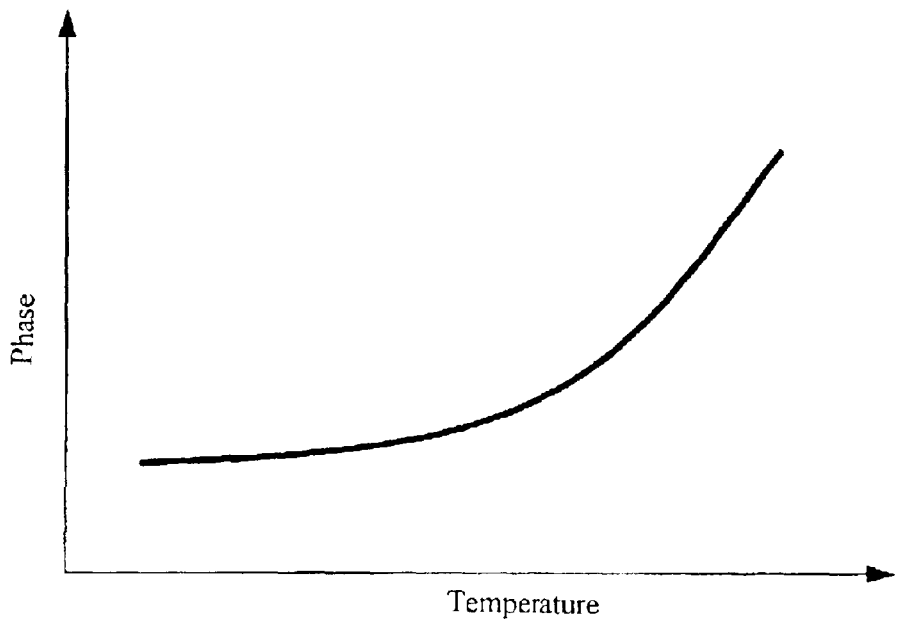
FIG. 4 is a characteristic curve graph showing the temperature-transmitting phase characteristic at frequency F1, higher than the resonance frequency FA of tank circuit.

FIG. 4 is a graph showing the temperature-transmitting phase characteristic at an arbitrary frequency F1 higher than the resonance frequency FA of this tank circuit 15 (see FIG. 3). For this tank circuit 15, as shown in FIG. 4, the variation of the transmitting phase due to a temperature change is small for low temperatures while the variation of the transmitting phase due to a temperature change increases in the case of high temperatures.

Namely, this tank circuit 15 has a characteristic such that in the range of high frequency, specifically, in a range where the frequency is higher than the resonance frequency FA, the variation of the transmitting phase for high temperatures is greater than a case of low temperatures.

Figure 21:
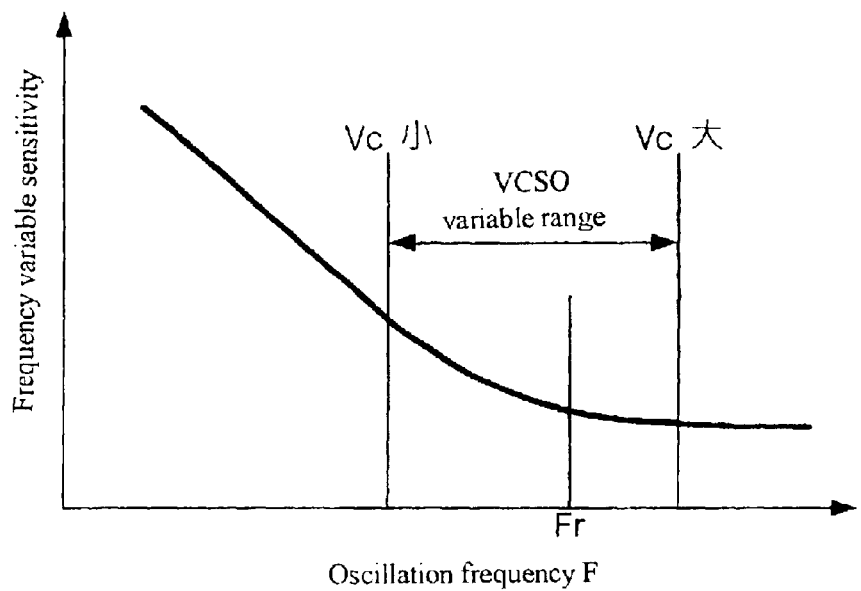
FIG. 21 is a characteristic curve graph showing the relationship of the oscillation frequency F and the sensitivity of the frequency variation of a conventional VCSO.
Figure 22:
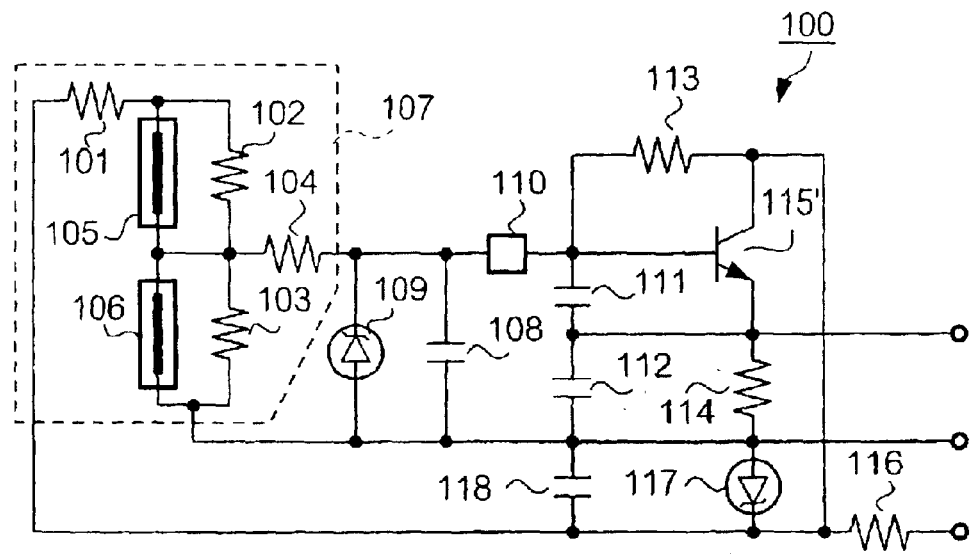
FIG. 22 is a circuit diagram showing the construction of a conventional VCSO.
Figure 23:
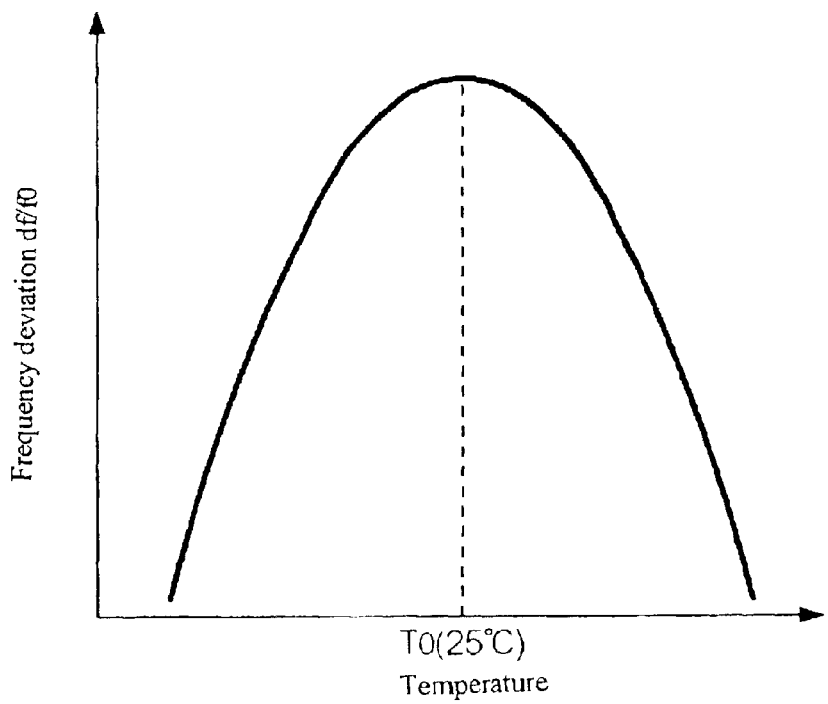
FIG. 23 is a characteristic curve graph showing the temperature characteristic of the oscillation frequency of the SAW resonator.
Figure 24:
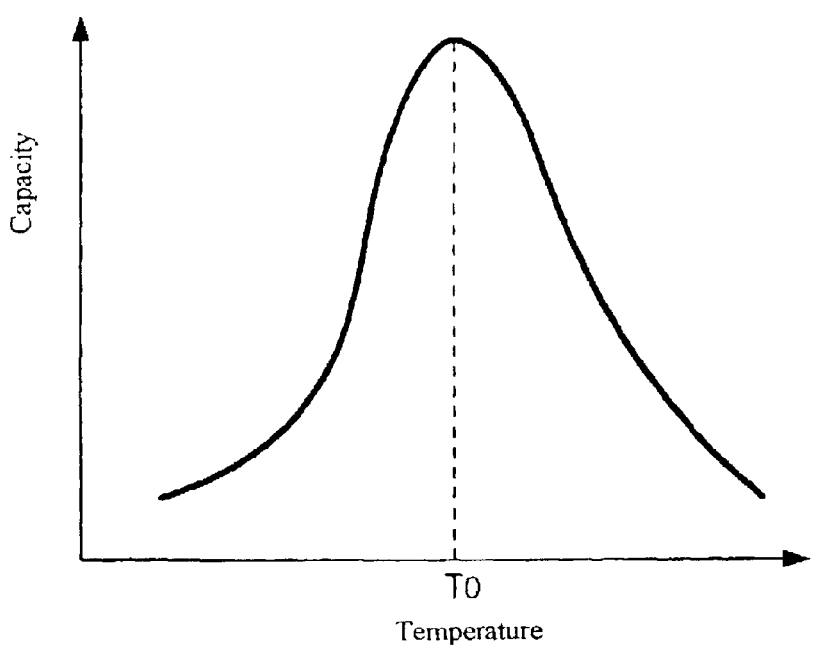
FIG. 24 is a characteristic curve graph showing the capacity characteristic of the capacitive element.
Figure 25:
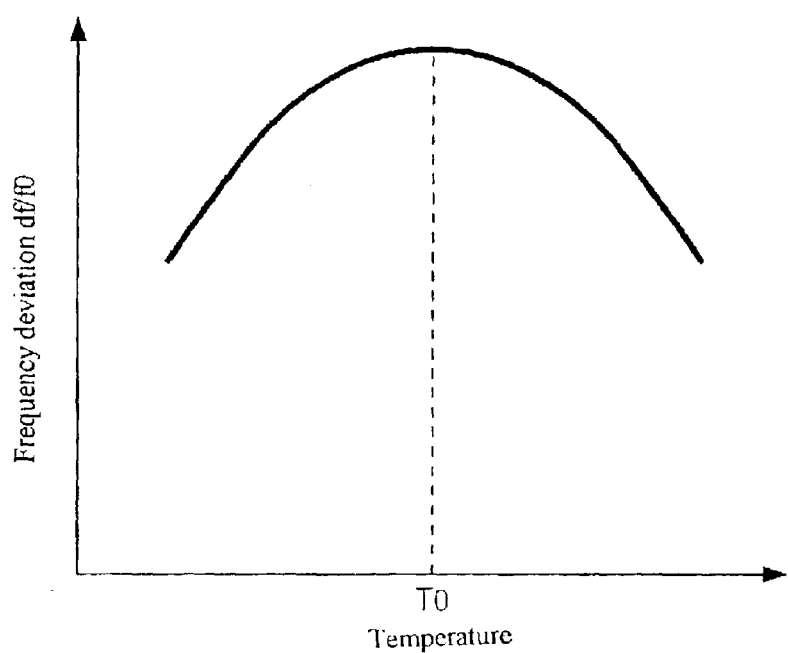
FIG. 25 is a characteristic curve graph showing the temperature characteristic of the oscillation frequency of the SAW resonator after correction.

Therefore, as shown in FIG. 21, in the conventional VCSO, the sensitivity of the frequency change decreases in a region of a high oscillation frequency F, i.e., at the time of a large control voltage $V_c$ and the sensitivity of frequency change increases in a region of a low oscillation frequency F, i.e., at the time of small control voltage $V_c$. By contrast, the oscillation circuit 1A relating to this embodiment increases the sensitivity of the frequency change even in a case of a high oscillation frequency F because it increases the variation of the transmitting phase in a high-frequency range by the tank circuit 15.

Figure 5:
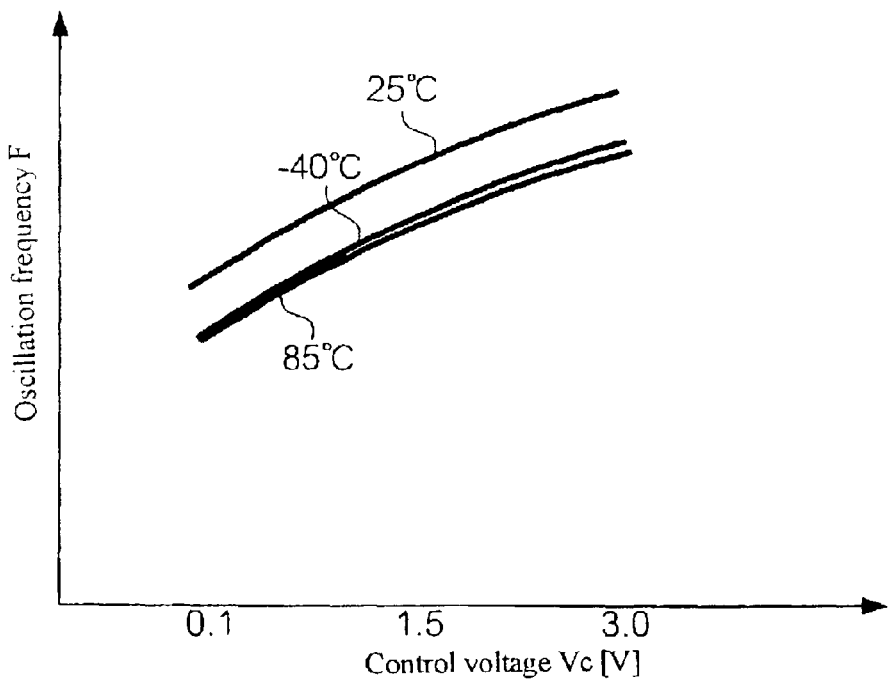
FIG. 5 is a characteristic curve showing the control voltage $V_c$-oscillation frequency F relationship of the oscillation circuit.

Accordingly, as the characteristic of the control voltage $V_c$—the oscillation frequency F of the oscillation circuit 1A is shown in FIG. 5, the oscillation circuit 1A can make the sensitivity of the frequency change to the control voltage $V_c$ nearly the same as in case of other temperature ranges even if the temperature is high.

Figure 6:
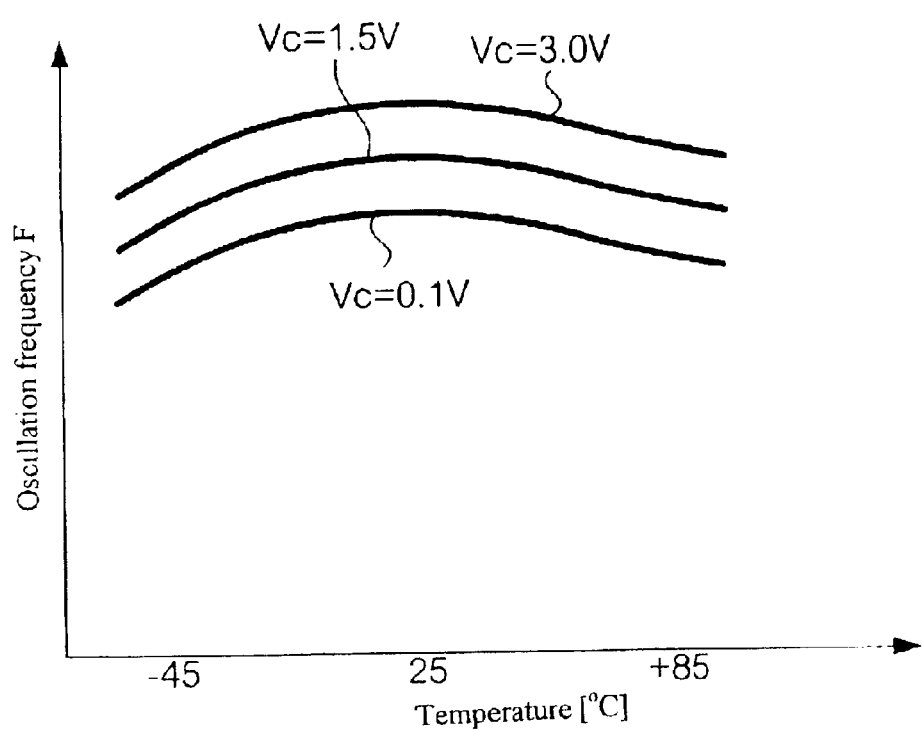
FIG. 6 is a characteristic curve graph showing the temperature characteristic of the oscillation frequency F of the oscillation circuit.
Figure 19:
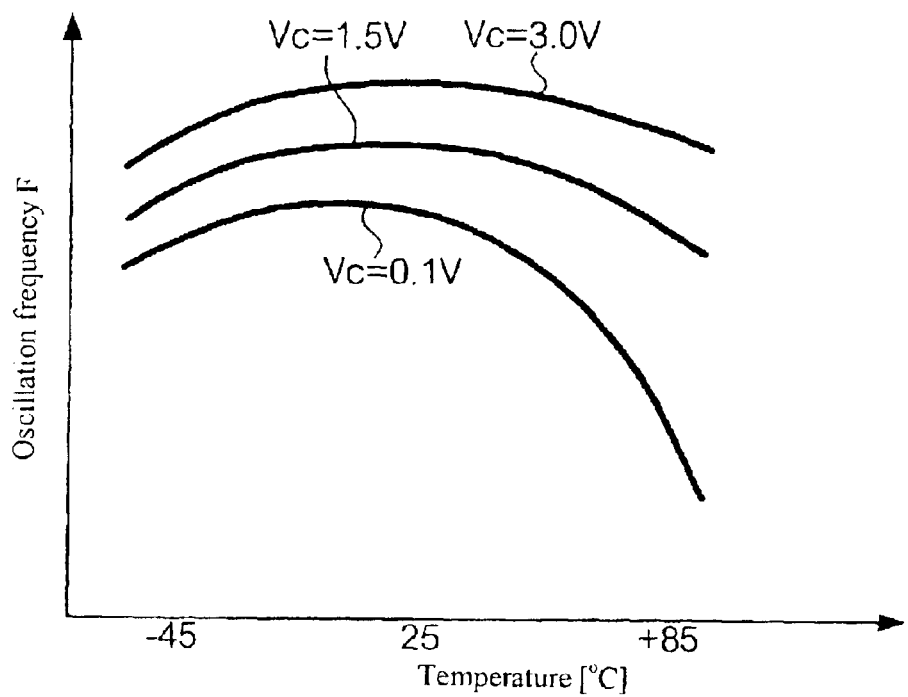
FIG. 19 is a characteristic curve graph showing the temperature characteristic of the oscillation frequency F of a conventional VCSO.
Figure 20:
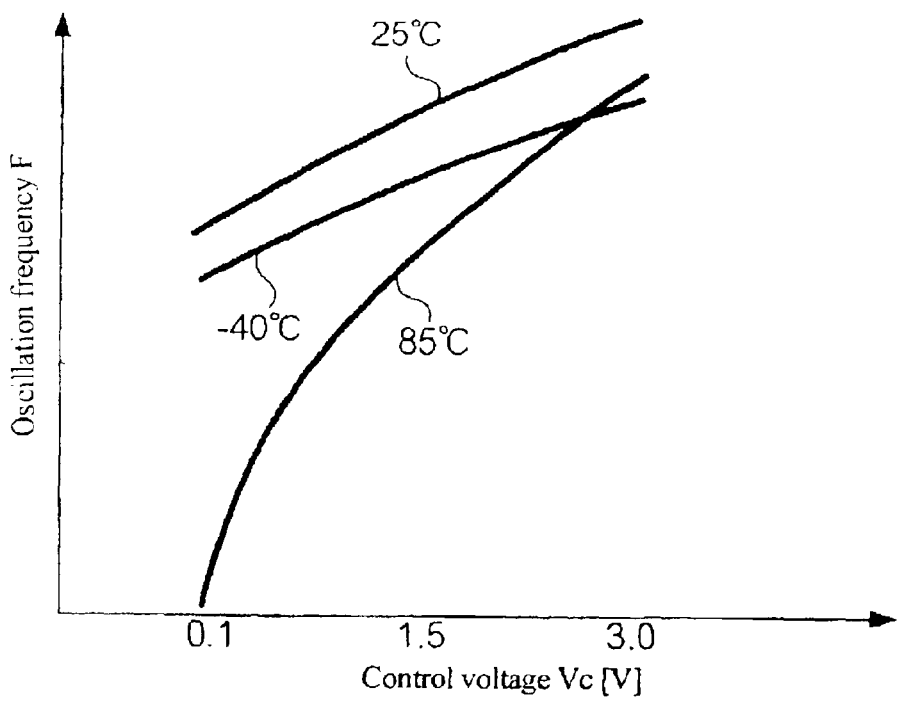
FIG. 20 is a characteristic curve graph showing the control voltage $V_c$-oscillation frequency F relationship of a VCSO.

As described above, in the case of a constant temperature and the control voltage $V_c$, the smaller the resistance value R of the NTC thermistor RT, the smaller the variation of the phase transmission for frequency change can be (see FIG. 3), therefore the change of oscillation frequency F due to temperature can be reduced in a wide temperature range as the temperature characteristic of oscillation frequency F of the oscillation circuit 1A is shown in FIG. 6. Particularly, it becomes possible to sharply reduce the temperature change in the high-temperature range as compared with the conventional temperature characteristic shown in FIG. 19.

As is evident from the above description, the oscillation circuit 1A relating to this embodiment enables improvement in the control voltage $V_c$-oscillation frequency F characteristic in a wide temperature range, especially in the high-temperature range and reduces the change of the oscillation frequency F due to temperature by use of the tank circuit 15 with NTC thermistor RT connected in parallel.

Moreover, it is possible to perform the phase adjustment of a positive feedback oscillation loop of this oscillation circuit 1A by laser trimming the electrodes of the capacitive element Cd of the tank circuit 15 to adjust the capacity value.

Figure 7:
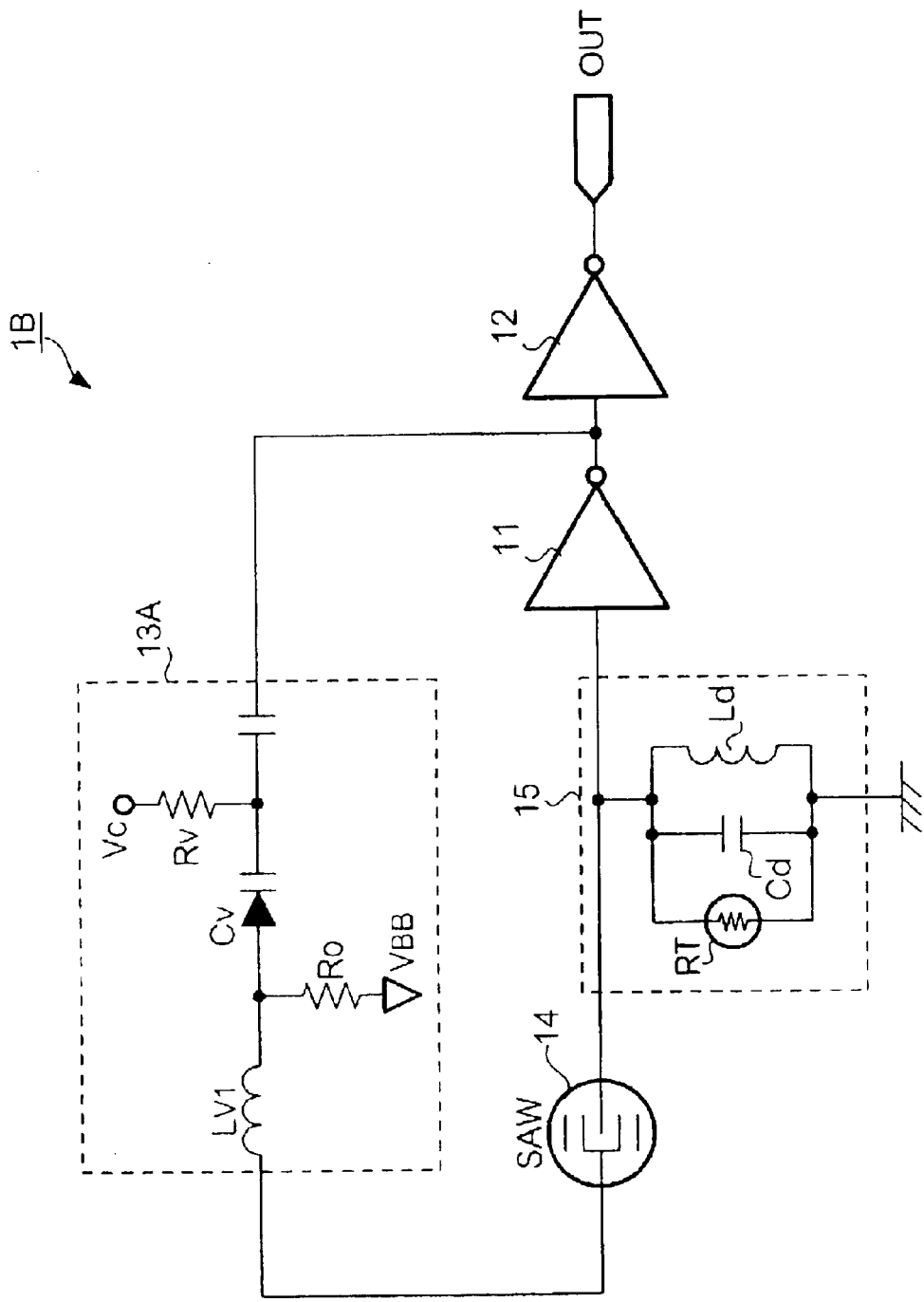
FIG. 7 is a block diagram showing a modification example of the oscillation circuit relating to Embodiment 1.

Furthermore, this invention is not limited to the oscillation circuit 1A of the above construction and is applicable to various oscillation circuits. For example, FIG. 7 is a block diagram for applying this invention to such an oscillation circuit 1B that the quantity of the phase shift can be voltage-controlled by applying a voltage-controlled phase-shifting circuit to a phase-shifting circuit 13A.

Figure 8:
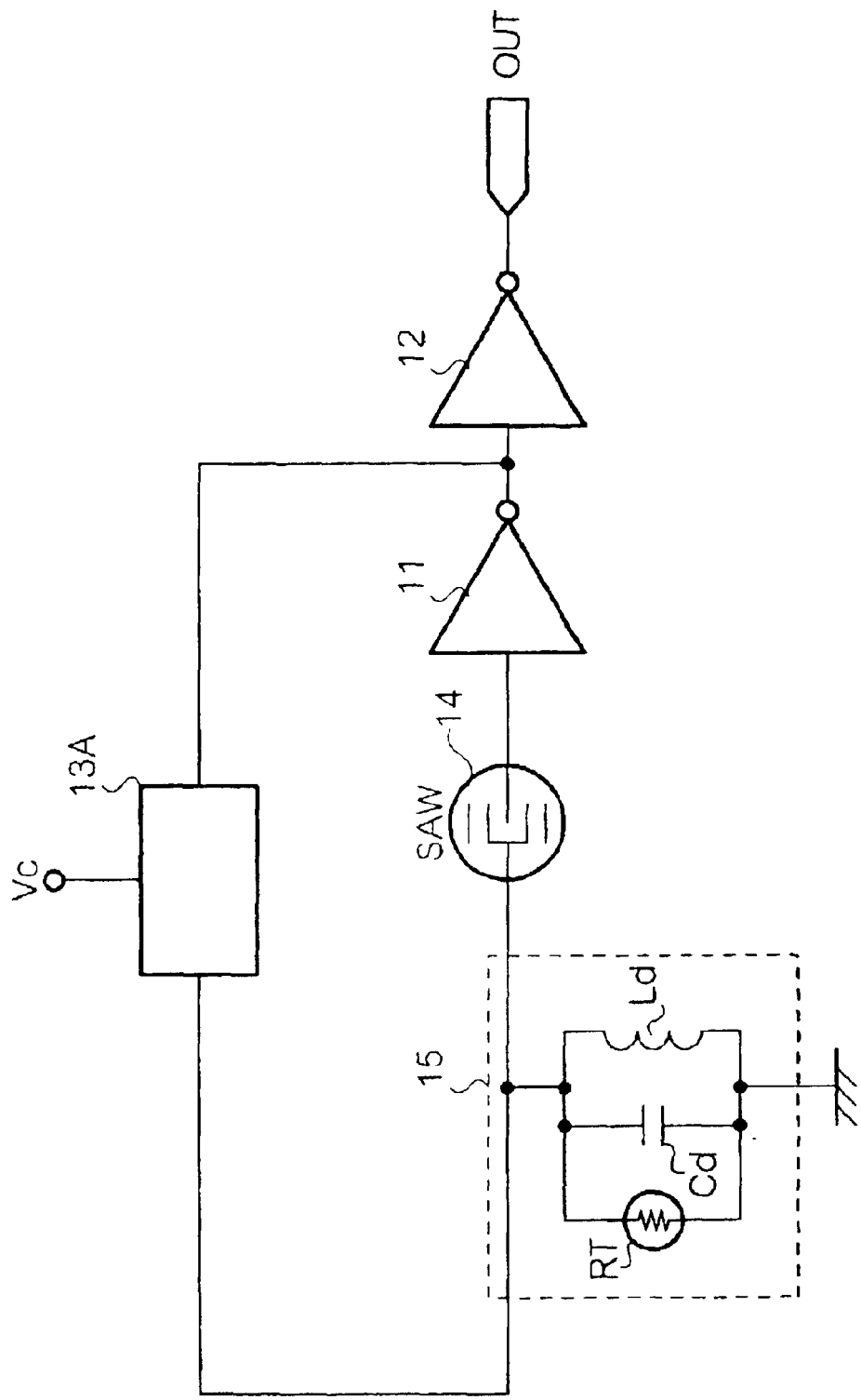
FIG. 8 is a block diagram showing a modification example of the oscillation circuit relating to Embodiment 1.

Still more, in the above oscillation circuit 1A, the positions of the circuits and elements in the positive feedback oscillation loop are arbitrarily switchable. For example, as shown in FIG. 8, the SAW resonator 14 and the tank circuit 15 may be switched in the positive feedback oscillation loop.

(2) Embodiment 2

An oscillation circuit 2A relating to Embodiment 2 is different from the oscillation circuit 1A relating to Embodiment 1 in using differential amplifiers with an ECL (emitter coupled logic) line receiver (called ECL differential amplifier). The same symbols are attached and shown for the same construction as the oscillation circuit 1A in Embodiment 1, and a detailed description is omitted.

Figure 9:
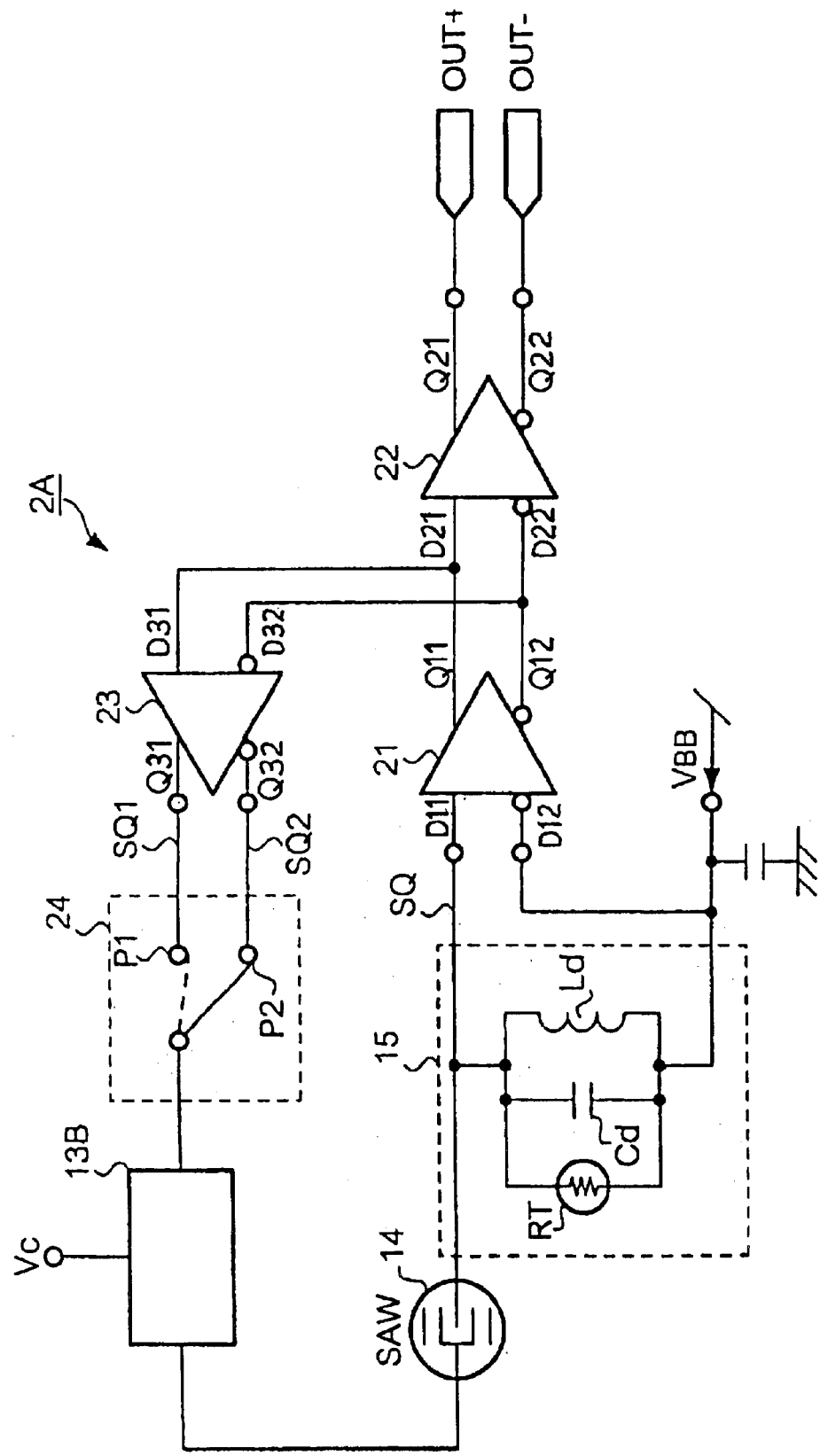
FIG. 9 is a block diagram showing the construction of the oscillation circuit relating to Embodiment 2.

FIG. 9 is a block diagram showing the construction of the oscillation circuit 2A relating to the Embodiment 2.

The oscillation circuit 2A comprises ECL differential amplifiers 21–23, a switch circuit 24, a phase-shifting circuit 13B for adjusting the quantity of the phase shift, a SAW resonator 14 and a tank circuit 15. A bias voltage VBB is supplied from the outside to an inverting input terminal D12 of the ECL differential amplifier 21. Then, a positive feedback oscillation loop is formed by the ECL differential amplifiers 21, 23, the switch circuit 24, the phase-shifting circuit 13B, the SAW resonator 14 and the tank circuit 15.

Moreover, this embodiment is constructed such that the bias voltage VBB is supplied to the inverting input terminal D12 of the ECL differential amplifier 21 and a positive feedback oscillation loop is connected to a non-inverting input terminal D11, but the bias voltage VBB may also be supplied to the non-inverting input terminal D11 of the ECL differential amplifier 21 and the positive feedback oscillation loop may also be connected to the inverting input terminal D12.

The ECL differential amplifiers 21–23 have a differential output of a non-inverting output and an inverting output, have a low consumption of power, suit a circuit requiring high-speed actuations such as a high-frequency oscillator, and are used to convert a resultant output signal to an electric level employed in the ECL differential amplifiers 21–23.

The tank circuit 15 has the same construction as the tank circuit 15 in the Embodiment 1, but it is different in that it is connected between the non-inverting input terminal D11 and the inverting input terminal D12 of the ECL differential amplifier 21.

In the ECL amplifier 21, a reference signal SQ of frequency f0 is supplied to the non-inverting input terminal D11 and the inverting input terminal D12 of the differential amplifier 21 via the tank circuit, and a bias voltage VBB is further supplied to the inverting input terminal D12. Thereby, the ECL differential amplifier 21 amplifies the reference signal SQ to a prescribed level and outputs it from the non-inverting output terminal Q11 and outputs a signal which is a signal given by amplifying the reference signal SQ to a prescribed level and has a 180° different phase from the inverting output terminal Q12 by differential amplification of the signals input into the input terminals D11, D12.

The ECL differential amplifier 23 outputs a signal SQ1 given by amplifying the reference signal SQ to a prescribed level and has a 180° different phase to the reference signal SQ from the inverting output terminal Q32 by supplying the signals output from the output terminals Q11 and Q12 of the ECL differential amplifier 21 to the non-inverting input terminal D31 and the inverting input terminal D32 thereof, respectively.

Similarly, the ECL differential amplifier 22 outputs an output signal OUT+ given by amplifying the reference signal SQ to a prescribed level and has a 180° different phase to the reference signal SQ from the inverting output terminal Q22, by supplying the signals output from the output terminals Q11 and Q12 of the ECL differential amplifier 21 to the non-inverting input terminal D21 and the inverting input terminal D22 of the ECL differential amplifier 23.

Moreover, the ECL differential amplifiers 22, 23 are provided to reduce the influence between the positive feedback oscillation loop and the outputs, and they may also be omitted.

The switch circuit 24 is a circuit for selecting a signal which requires a small quantity of the phase shift of the phase-shifting circuit 13B in the reference signals SQ1, SQ2 which are output from the ECL differential amplifier 23 and have 180° different phases. In greater detail, the switch circuit 24 selects the reference signal SQ flowing in the positive feedback oscillation loop by selectively connecting either a connection P1 connected to the non-inverting terminal Q31 of the ECL differential amplifier 23 or a connection P2 connected to the inverting output terminal Q32 of the ECL differential amplifier 23. Therefore, the quantity of the phase shift of the phase-shifting circuit 13B can be small and the circuit construction can be simplified. Of course, when the selection of the connection P1 and connection P2 is known in the circuit design stage, the switch circuit 24 may also be omitted.

Moreover, the phase-shifting circuit 13B selects an appropriate quantity of the phase shift according to the oscillation frequency F of the SAW resonator 14 and the construction of circuit parts, but the phase-shifting circuit 13B can use nearly the same circuit pattern for plural types of SAW resonators and enables a simplification in the design because it requires a small change of the quantity of the phase shift even if the SAW resonator 14 is changed.

Furthermore, when fixing the oscillation frequency F of the SAW resonator 14 and the construction of circuit parts, the phase-shifting circuit 13B may be omitted, and a circuit pattern connecting the positive feedback oscillation loop for either of two signals SQ1, SQ2 output from the ECL differential amplifier 23 may be prepared. In this case, it may also be short-circuited with either connection P1 or connection P2 by wire bonding, etc. in place of the switch circuit 24.

Accordingly, in the oscillation circuit 2A using the ECL differential amplifiers 21–23, the sensitivity of frequency change can also be increased and the sensitivity of frequency change to the control voltage $V_c$ can also be made nearly the same as in a wide temperature range even in the case of high oscillation frequency F, by using the tank circuit 15 with the NTC thermistors RT connected in parallel.

Still more, when the temperature and the control voltage $V_c$ are constant, the smaller the resistance values R of the NTC thermistors RT, the smaller the variation of phase transmission to the frequency change can be (see FIG. 3), therefore the temperature change in the high-temperature range can be sharply reduced and the change of the oscillation frequency F due to temperature can be reduced in a wide temperature range.

Still furthermore, a gain can be selectively given to the ECL differential amplifier 21 by inserting the tank circuit 15 to prevent an abnormal oscillation.

This enables the improvement of the control voltage $V_c$ oscillation frequency F characteristic in a wide temperature range, especially in a high-temperature range and reduces the change of the oscillation frequency F due to temperature in the oscillation circuit 2A using the ECL differential amplifiers 21–23.

Figure 10:
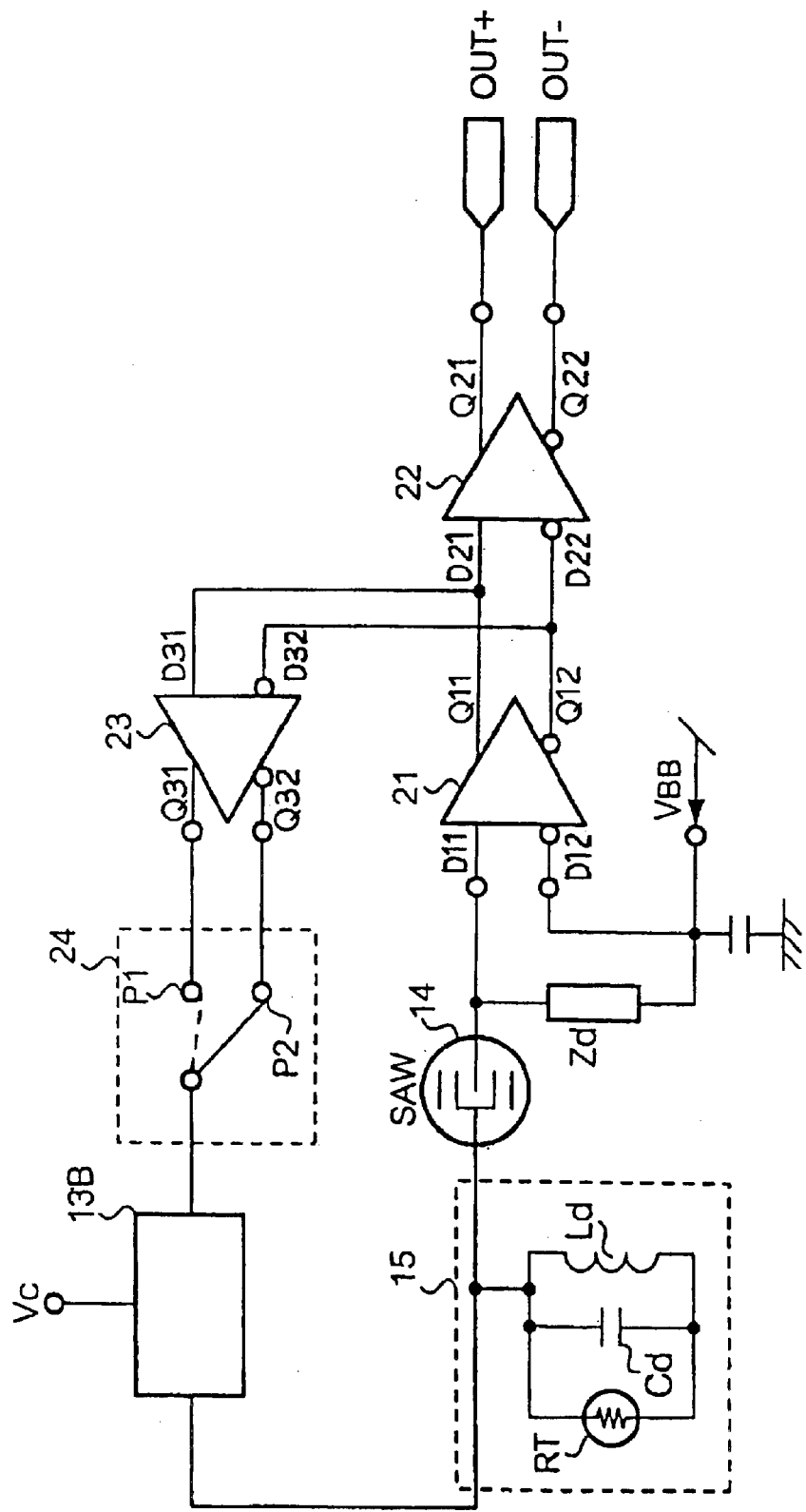
FIG. 10 is a block diagram showing the modification example of the oscillation circuit relating to Embodiment 2.

In the above oscillation circuit 2A, the positions of the circuits and elements in the positive feedback oscillation loop are arbitrarily switchable. For example, as shown in FIG. 10, the SAW resonator 14 and the tank circuit 15 may be switched in the positive feedback oscillation loop. In this case, an arbitrary impedance Zd must be inserted, so that a potential difference occurs between the inverting input terminal D11 and the non-inverting input terminal D12 of the differential amplifier 21.

(3) Embodiment 3

The case for improving the temperature characteristic of the oscillation frequency F by using the tank circuit 15 with NTC thermistors RT connected in parallel was described in the above-mentioned embodiment, and an oscillation circuit for improving the temperature characteristic of the oscillation frequency F by another method is illustrated in this embodiment.

Figure 11:
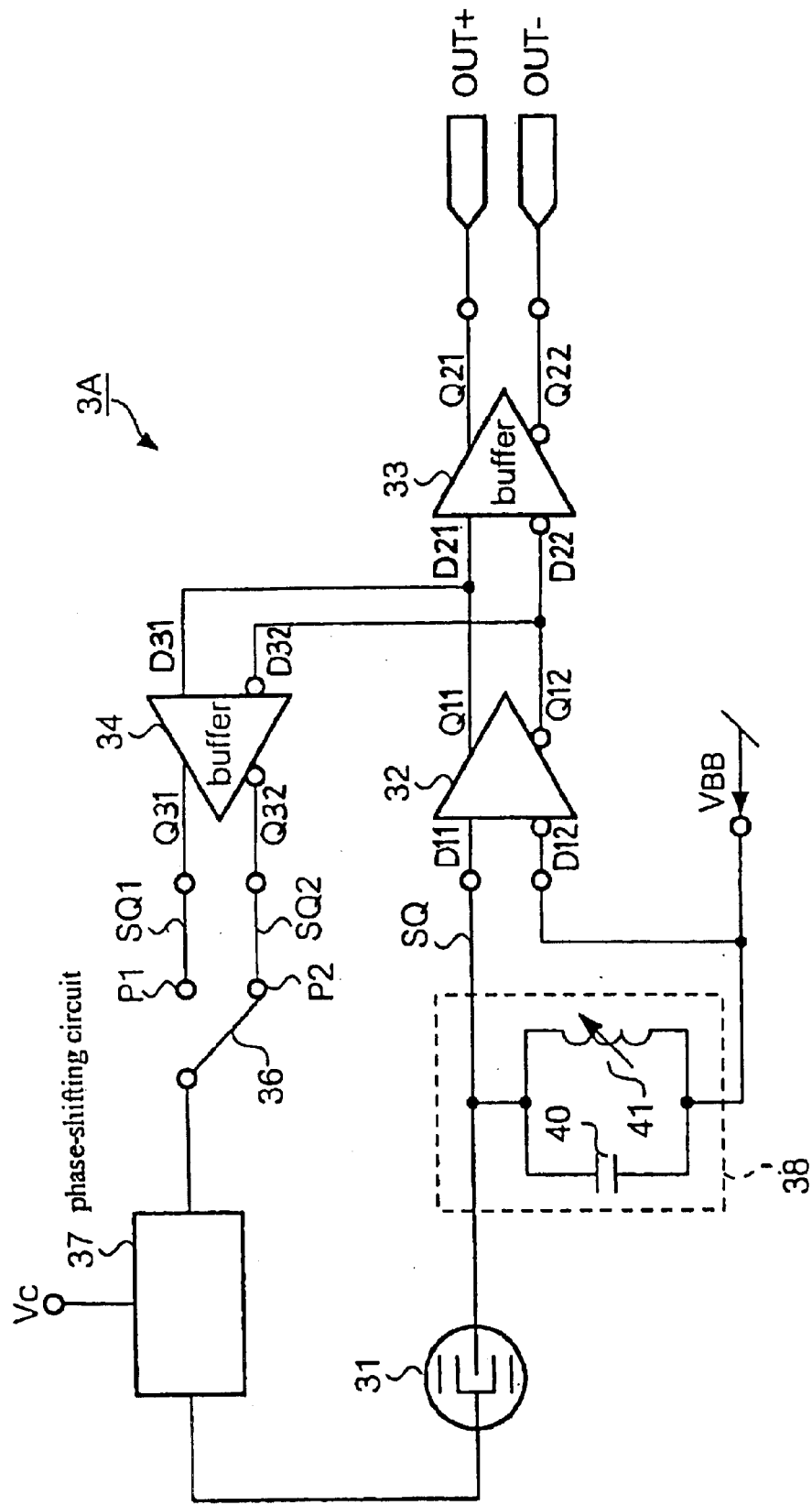
FIG. 11 is a block diagram showing the construction of the oscillation circuit relating to Embodiment 3.

FIG. 11 is a block diagram showing the construction of an oscillation circuit 3A relating to the Embodiment 3. The oscillation circuit 3A comprises a SAW resonator 31, ECL differential amplifiers 32–34, a switch circuit 36, a phase-shifting circuit 37 and a tank circuit 38. Then, a positive feedback oscillation loop is formed by the ECL differential amplifiers 32, 34, the switch circuit 36, the phase-shifting circuit 37, the SAW resonator 31 and the tank circuit 38.

The tank circuit 38 selectively gives a gain to a desirable frequency by adopting a resonance circuit construction composed of a capacitive element 40 and an inductance element 41. Here, the tank circuit 38 selects a reference signal SQ having a frequency f0 from a reference oscillation signal given by the SAW resonator 31 and outputs it to the differential amplifier 32.

A reference signal SQ flowing through the positive feedback oscillation loop is supplied to the non-inverting input terminal D11 and the inverting input terminal D12 of the differential amplifier 32 via the tank circuit 38, and a bias voltage VBB is further supplied to the inverting input terminal D12. Thereby, the differential amplifier 32 amplifies the reference signal SQ to a prescribed level and outputs it from the non-inverting output terminal Q11 and outputs a signal which is a signal given by amplifying the reference signal SQ to a prescribed level and has a 180° different phase from the inverting output terminal Q12 by differential amplification of signals input into the input terminals.

The differential amplifier 34 outputs a signal SQ1 given by amplifying a reference signal SQ to a prescribed level from the non-inverting output terminal Q31 and outputs a signal SQ2 which is a signal given by amplifying the reference signal SQ to a prescribed level and has a 180° different phase to the reference signal SQ from the inverting output terminal Q32 by supplying the signals output from the output terminals Q11 and Q12 of the differential amplifier 32 to the non-inverting input terminal D31 and the inverting input terminal D32, respectively.

Similarly, the differential amplifier 33 outputs an output signal OUT+ given by amplifying the reference signal SQ to a prescribed level from the non-inverting output terminal Q21 and outputs an output signal OUT− which is a signal given by amplifying the reference signal SQ to a prescribed level and has a 180° different phase to the reference signal SQ from the inverting output terminal Q22, by supplying the signals output from the output terminals Q11 and Q12 of the differential amplifier 32 to the non-inverting input terminal D21 and the inverting input terminal D22.

Moreover, the differential amplifiers 33, 34 are provided to reduce an influence between the positive feedback oscillation loop and the outputs, and they may also be omitted.

The switch circuit 36 is a circuit for selecting a signal which requires a small quantity of the phase shift of the phase-shifting circuit 37 in the reference signals SQ1, SQ2 which are output from the differential amplifier 34 and have 180° different phases. If illustrated in more detail, the switch circuit 36 selects the reference signal SQ flowing through the positive feedback oscillation loop by selectively connecting either a connection P1 connected to the non-inverting output terminal Q31 of the differential amplifier 34 or a connection P2 connected to the inverting terminal Q32 of the differential amplifier 34.

The phase-shifting circuit 37 performs a phase adjustment for satisfying the phase conditions of the oscillation circuit 3A and adjusts the quantity of the phase shift of the inputted output signal SQ according to an input controlled signal $V_c$. As described above, the oscillation circuit 3A relating to this embodiment enables the selection of a signal which requires a small quantity of the phase shift of the phase-shifting circuit 37 of reference signals SQ1 and SQ2 having different phases from each other and simplify the circuit construction of the phase-shifting circuit 37.

Moreover, the phase-shifting circuit 37 selects an appropriate quantity of the phase shift according to the oscillation frequency F of the SAW resonator 14 and the construction of the circuit parts, but the phase-shifting circuit 37 can use nearly the same circuit pattern for plural types of SAW resonators and enables a simplification in design because it requires a small change of the quantity of the phase shift even if the SAW resonator 31 is changed.

Furthermore, in such a case of fixing the oscillation frequency F of the SAW resonator 14 and the construction of the circuit parts, the phase-shifting circuit 37 may be omitted, and a circuit pattern connecting the positive feedback oscillation loop for either of two signals SQ1, SQ2 output from the differential amplifier 34 may be prepared. In this case, it may also be short-circuited with either connection P1 or connection P2 by wire bonding, etc. in place of the switch circuit 36.

Still more, the oscillation circuit 3A relating to this embodiment makes a correction for the temperature characteristic of the oscillation frequency F of the SAW resonator 31 by using a capacitive element with a prescribed capacitive-temperature characteristic as the capacitive element 40 of the tank circuit 38. The capacitive element 40 of the tank circuit 38 is illustrated below.

Figure 12:
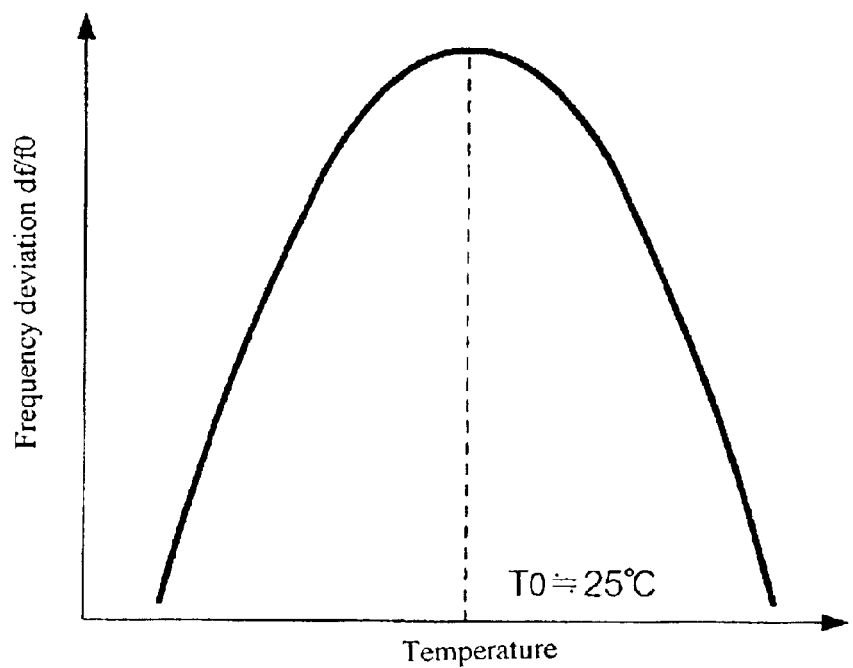
FIG. 12 is a characteristic curve graph showing the temperature characteristic of the oscillation frequency F of the SAW resonator.

FIG. 12 is a graph showing the temperature characteristic of the oscillation frequency F of the SAW resonator 31. Like a tuning-fork type quartz crystal, the SAW resonator 31 has a quadratic frequency temperature characteristic which can be approximated by a quadratic curve. Here, when a frequency summit temperature T0 at which the maximum frequency of the SAW resonator 31 is obtained and a summit temperature at which the capacity of capacitive element 40 of the tank circuit 38 maximizes are greatly different, the temperature may be overcompensated or undercompensated on the high temperature side or the low temperature side of a compensation temperature range.

Figure 13:
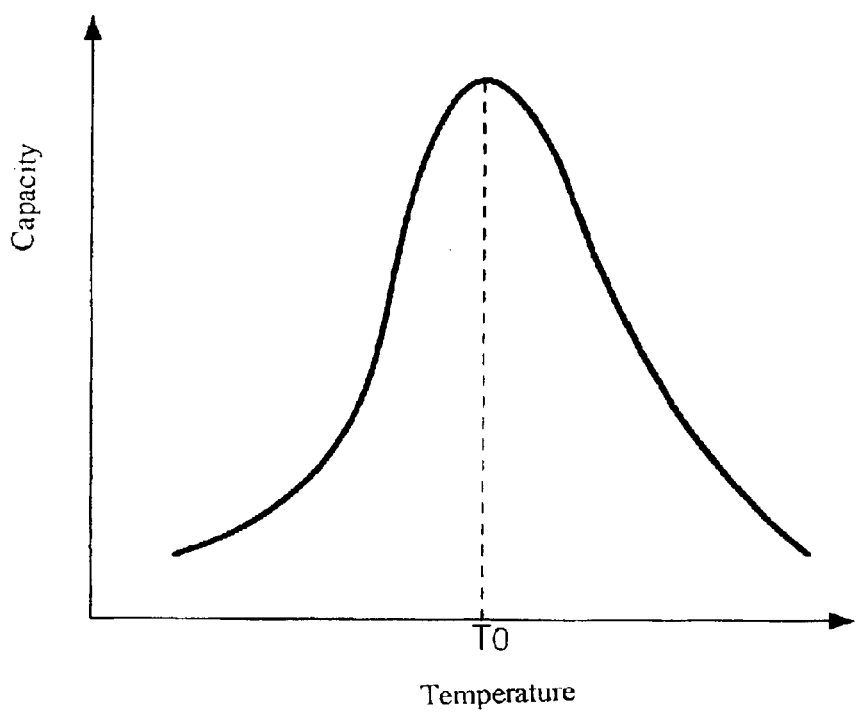
FIG. 13 is a characteristic curve graph showing the capacity-temperature characteristic of the capacitive elements of the tank circuit.

Therefore, in this embodiment, as the capacity-temperature characteristic of the capacitive element 40 is shown in FIG. 13, a capacitive element having such a quadratic capacity-temperature characteristic that the capacity maximizes in case of frequency summit temperature T0 of the SAW resonator 31 is used as the capacitive element 40, to maximize the compensation effect. Moreover, when the capacitive element 40 takes $BaTiO_3$ as the main component, the Curie-point temperature of 120° C. which is a temperature showing the maximum capacity value of $BaTiO_3$ shifts to the frequency summit temperature T0 by other elements, e.g., $BaSnO_3$, $CaSnO_3$, $BaSnO_3$, $BaZrO_3$, $BaTiO_3$ or the like.

Figure 14:
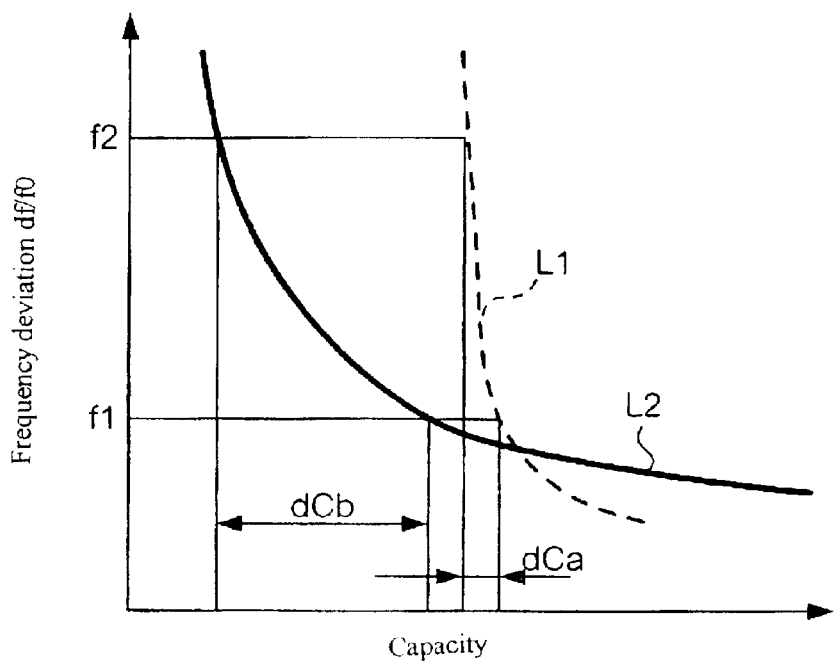
FIG. 14 is a graph showing the characteristic curve L1 expressing the relationship between the capacity of the capacitive element of the tank circuit and the oscillation frequency F and the characteristic curve L2 expressing the relationship between the capacity of the capacitive element directly connected to a positive feedback oscillation loop and the oscillation frequency F.

FIG. 14 is a characteristic curve graph having a characteristic curve L1 showing a relationship between the capacity Ca of capacitive element 40 of the tank circuit 38 and the oscillation frequency F (frequency deviation df/f0) and a characteristic curve L2 showing a relationship between the capacity of a capacitive element Cb, in the case of using one condenser as an example of the phase-shifting circuit 37 and the oscillation frequency F (frequency deviation df/f0).

As shown in this graph, it is known that the necessary capacity variation dCa of the capacitive element 40 in the case of changing the oscillation frequency F by a prescribed quantity (f2−f1) is much smaller than the capacity variation dCb of the capacitive element Cb directly connected to the positive feedback oscillation loop. In this graph, it is known that the capacity variation dCa may be about ¼ or less of the capacity variation dCb.

Figure 15:
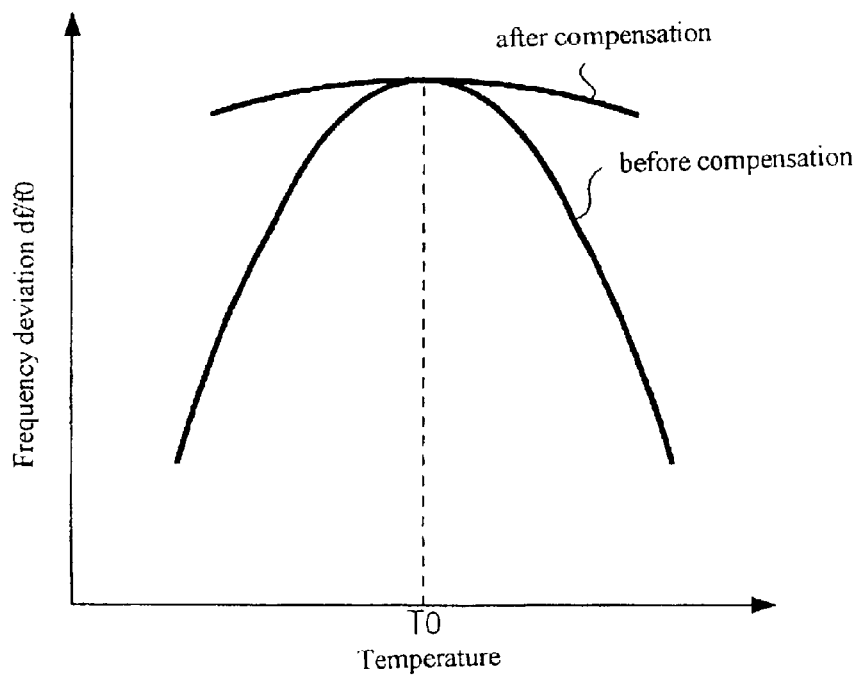
FIG. 15 is a characteristic curve graph showing the temperature characteristic of the oscillation frequency F before correction and after correction.

Accordingly, in this oscillation circuit 3A, a big correction for the temperature characteristic of the oscillation frequency F can be taken as compared to the case of correcting it by the temperature characteristic of capacity value of the capacitive element Cb directly connected to the positive feedback oscillation loop because the temperature characteristic of oscillation frequency F of the SAW resonator 31 is corrected by the temperature characteristic of capacity of capacitive element 40 of the tank circuit 38. Therefore, as the temperature characteristic of the oscillation frequency F of the oscillator 30 before the correction and the temperature characteristic after the correction are shown in FIG. 15, the temperature characteristic of the oscillation frequency F of the SAW resonator 31 is reduced in a wide temperature range.

This, with the oscillation circuit 3A, satisfies a required frequency stability (e.g., $10.0 \times 10^{-6}$) even in the high-temperature and the low-temperature ranges where the correction is insufficient, when the temperature characteristic of the SAW resonator 31 is corrected by the temperature characteristic of the capacitive element Cb directly connected to the conventional positive feedback oscillation loop.

Moreover, the variation of the oscillation frequency F for the capacity change of this capacitive element 40, i.e., the sensitivity adjustment of the oscillation frequency F, can be adjusted by the value of the inductance element of the tank circuit 38.

As is evident from the above description, if the capacitive element 40 of the tank circuit 38 is made into a capacitive element having the above-mentioned temperature characteristic according to the frequency-temperature characteristic of the SAW resonator 31, the oscillation circuit 3A relating to this embodiment simplifies the correction of the frequency-temperature characteristic of the SAW resonator 31 in a wide temperature range. Moreover, it requires a small mounting space and thus also enables the miniaturization of the oscillator 30 because the number of elements also does not increase.

(4) Embodiment 4

The oscillation circuits 1A, 1B, 2A, 3A relating to the above-mentioned embodiments are applicable to various communication equipment. In this embodiment, an optical interface module 50 is illustrated as a communication equipment using the oscillation circuits 1A–3A relating to this invention.

Figure 16:
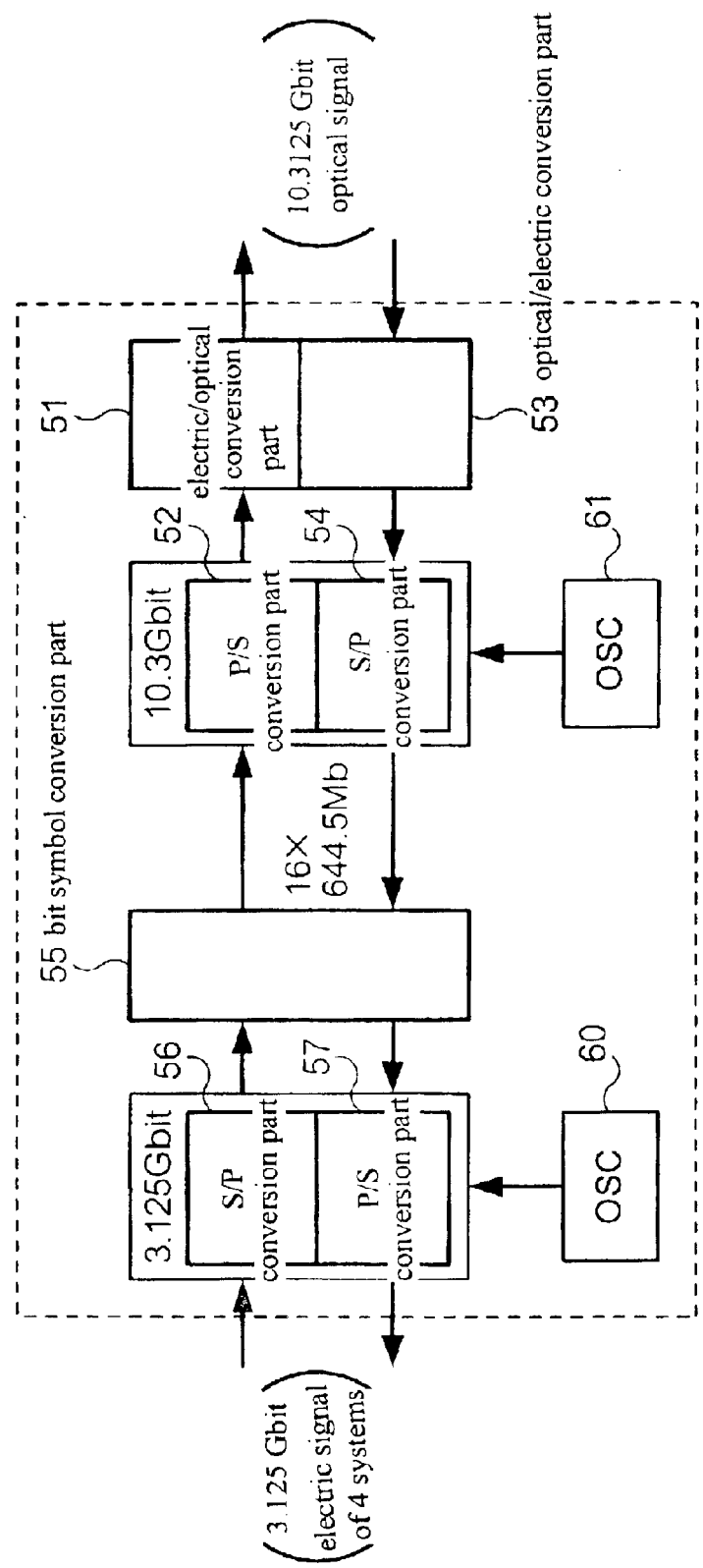
FIG. 16 is a block diagram showing the schematic construction of the optical interface module.
Figure 17:
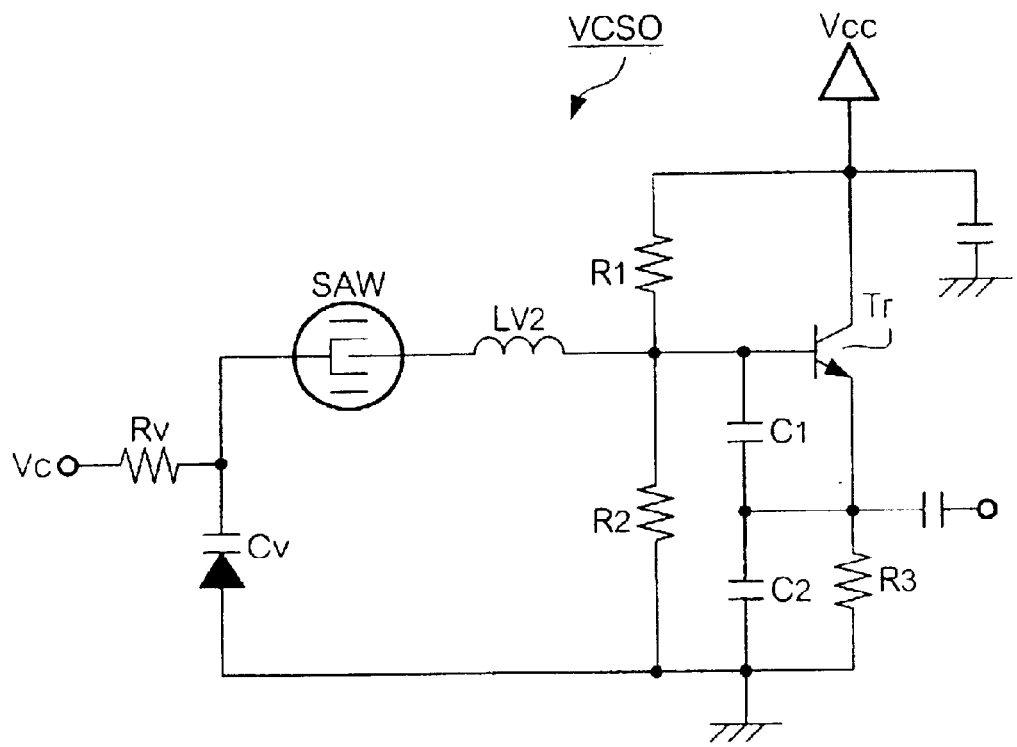
FIG. 17 is a circuit diagram of a conventional VCSO.
Figure 18:
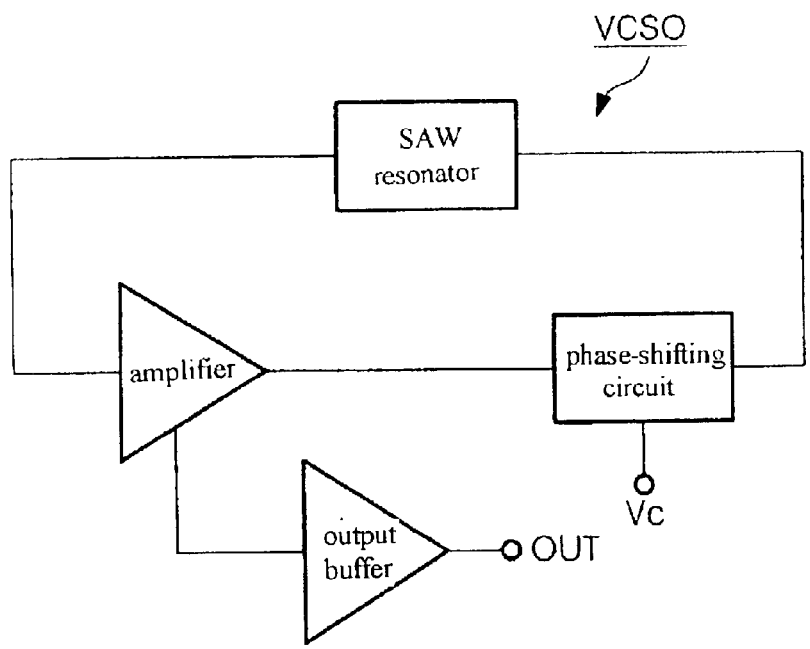
FIG. 18 is a block diagram showing the construction of a conventional VCSO.

FIG. 16 is a block diagram showing a schematic construction of the optical interface module 50.

This optical interface module 50, for example, performs the signal conversion of an optical signal and an electric signal between a servo computer and an optical network. Here, it performs the signal conversion of an optical signal of 10.3125 Gbit and an electric signal of 3.125 Gbps (4 systems).

An electric/optical conversion part 51 converts an electric signal output from a P/S (Parallel/Serial) conversion part 52 to an optical signal and outputs it to the optical network side. An optical/electric conversion part 53 converts the optical signal output from the optical network side to an electric signal and outputs it to the P/S (Parallel/Serial) conversion part 54.

Any of the above-mentioned oscillation circuits 1A–3A are suitable for oscillation circuits 60, 61, and they output a clock signal of constant frequency independently of the ambient temperature. Then, the clock signal is taken as reference signal and used in an S/P conversion part 56 and an S/P conversion part 57 of 3.125 Gbit and the S/P conversion part 52 and the S/P conversion part 54 of 10.3125 Gbit connected via the bit symbol conversion part 55.

Thus, this embodiment enables the performance of data sending and reception via a stabilized optical network independently of the ambient temperature, especially in the high-temperature range by using the oscillation circuits 1A–3A relating to the embodiments in the optical interface module 50.

(5) Modified Embodiments

The invention of this application is not limited to the above-mentioned embodiments and can be embodied by various modes. For example, modified embodiments as described below are possible.

The cases of applying this invention to the oscillation circuits with a SAW resonator as the oscillation source were described in the above-mentioned embodiment, but this invention can also be applied to the oscillation circuits with an AT cut quartz crystal resonator as oscillation source. Moreover, a temperature compensation circuit may also be connected to the oscillation circuits of this invention to construct TCSO or TCXO. Furthermore, in addition to quartz crystal, other piezoelectric materials such as langasite crystal or lithium tetra borate or the like may also be used for piezoelectric materials constructing resonators or piezoelectric resonators such as SAW resonator and so on.

The case of using a capacitive element with such a quadratic capacity temperature characteristic that the capacity maximizes at the frequency summit temperature T0 was described as the capacitive element 40 of the tank circuit 38 in the above-mentioned Embodiment 3. This invention is not limited thereto, in short, a capacitive element with such a capacity-temperature characteristic that the capacity maximizes at the frequency summit temperature T0 may be used, or the Curie-point temperature may be near to the frequency summit temperature T0.

Moreover, in the case that plural capacitive elements exist in the tank circuit 38, more corrections can be taken if all the capacitive elements have the above-mentioned capacity-temperature characteristic, but any one or more of the capacity elements may also have the above-mentioned capacity-temperature characteristic according to a required correction.

As described above, the oscillation circuits based on this invention enable the improvement of the control voltage-oscillation frequency characteristic in a wide temperature range, especially in a high-temperature range by using tank circuits with NTC thermistors connected in parallel and reduce the change of the oscillation frequency due to temperature. Moreover, they enable a reduction in the temperature change of the oscillation frequency due to temperature in a wide temperature range by correcting the temperature characteristic of the oscillation frequency of an resonator according to the temperature characteristic of capacitive elements of the tank circuits. Furthermore, the oscillation circuits require a small mounting space and enable miniaturization because the number of elements does not increase.

The entire disclosures of Japanese Application Nos. 2001-232458, filed Jul. 31, 2001, 2001-317283 filed Oct. 15, 2001 and 2002-130074 filed May 1, 2002 are incorporated by reference.

What is claimed is:

1. An oscillation circuit comprising:
   a positive feedback oscillation loop including:
      an amplifier;
      a SAW resonator with a prescribed oscillation frequency;
      a phase-shifting circuit outputting a phase of an input signal with a prescribed shift as an output signal that is connected to the resonator;
      a tank circuit including inductance elements and capacitive elements, wherein the tank circuit is connected in series with the SAW resonator and the amplifier; and
      an NTC thermistor having a negative temperature characteristic connected in parallel to the tank circuit.

2. The oscillation circuit described in claim 1, wherein the amplifier further comprises a differential amplifier, having an inverting input terminal and a non-inverting input terminal, in which a bias voltage is input into either side of the inverting input terminal or the non-inverting input terminal and the other side functions as the input end of the positive feedback oscillation loop.

3. The oscillation circuit described in claim 2, wherein the tank circuit is connected between the inverting input terminal and the non-inverting input terminal of the differential amplifier.

4. An oscillation circuit comprising:
   an amplifier;
   a resonator having a quadratic frequency-temperature characteristic;
   a phase-shifting circuit outputting a phase of an input signal with a prescribed shift as an output signal that is connected to the resonator;
   a feedback amplifier circuit oscillating the resonator; and
   a tank circuit having frequency selectivity at a nearby desirable frequency connected in series with the resonator and the amplifier;
   wherein any one or more of a plurality of capacitive elements included in the tank circuit has a capacity-temperature characteristic correcting the quadratic frequency-temperature characteristic of the resonator.

5. The oscillation circuit described in claim 4, wherein any one or more of the plurality of capacitive elements included in the tank circuit has a capacity-temperature characteristic with a maximum capacity in a vicinity of a temperature at which a maximum oscillation frequency of the resonator is obtained.

6. The oscillation circuit described in claim 4, wherein the oscillation circuit has a phase-shifting circuit for changing the phase of a reference signal flowing into a positive feedback oscillation loop by a prescribed quantity and outputting the signal to satisfy the phase conditions of the oscillation circuit.

7. The oscillation circuit described in claim 6, wherein the phase-shifting circuit adjusts the phase-shift quantity with an external signal.

8. The oscillation circuit described in claim 6, wherein the amplifier further comprises a differential amplifier using an ECL line receiver.

9. An electronic device including the oscillation circuit described in claim 4,
   wherein the phase-shifting circuit adjusts the phase-shift quantity with an external signal; and
   wherein the amplifier further comprises a differential amplifier using an ECL line receiver.

10. The oscillation circuit described in claim 1, wherein the phase-shifting circuit adjusts the phase-shift quantity with an external signal.

11. The oscillation circuit described in claim 2, wherein the phase-shifting circuit adjusts the phase-shift quantity with an external signal.

12. An oscillation circuit comprising:
    a positive feedback oscillation loop including:
       an amplifier;
       a SAW resonator with a prescribed oscillation frequency;
       a phase-shifting circuit outputting the phase of an input signal with a prescribed shift as an output signal that is connected to the resonator; and
       a tank circuit including inductance elements and capacitive elements, wherein the tank circuit is connected in series with the SAW resonator and the amplifier; and
       an NTC thermistor having a negative temperature characteristic connected in parallel to the tank circuit;
       wherein the amplifier further comprises a differential amplifier, having an inverting input terminal and a non-inverting input terminal, in which a bias voltage is input into either side of the inverting input terminal or the non-inverting input terminal and the other side functions as the input end of the positive feedback oscillation loop;
       wherein the tank circuit is connected between the inverting input terminal and the non-inverting input terminal of the differential amplifier; and
       wherein the phase-shifting circuit adjusts the phase-shift quantity with an external signal.

13. The oscillation circuit described in claim 12, wherein the amplifier further comprises a differential amplifier using an ECL line receiver.

14. An electronic device comprising:
    an oscillation circuit as described in claim 12; and
    a circuit that receives an oscillation signal from said oscillation circuit.

15. An electronic device comprising:
    an oscillation circuit as described in claim 4; and
    a circuit that receives an oscillation signal from said oscillation circuit.

* * * * *